US012783350B2

(12) United States Patent
Rooney et al.

(10) Patent No.: US 12,783,350 B2
(45) Date of Patent: Nov. 3, 2026

(54) ERROR CHECK AND SCRUB FOR SEMICONDUCTOR MEMORY DEVICE

(71) Applicant: Lodestar Licensing Group LLC, Evanston, IL (US)

(72) Inventors: Randall J. Rooney, Boise, ID (US); Matthew A. Prather, Boise, ID (US)

( * ) Notice: Subject to any disclaimer, the term of this patent is extended or adjusted under 35 U.S.C. 154(b) by 6 days.

(21) Appl. No.: 18/778,726

(22) Filed: Jul. 19, 2024

(65) Prior Publication Data

US 2024/0370336 A1 Nov. 7, 2024

Related U.S. Application Data

(63) Continuation of application No. 18/195,374, filed on May 10, 2023, now Pat. No. 12,056,008, which is a continuation of application No. 17/571,189, filed on Jan. 7, 2022, now Pat. No. 11,687,410, which is a continuation of application No. 16/816,024, filed on Mar. 11, 2020, now Pat. No. 11,221,913.

(51) Int. Cl.

| | |
|---|---|
| ***G06F 11/10*** | (2006.01) |
| ***G11C 11/406*** | (2006.01) |
| ***G11C 11/408*** | (2006.01) |
| ***G11C 29/42*** | (2006.01) |

(52) U.S. Cl.
CPC ........ *G06F 11/1068* (2013.01); *G06F 11/106* (2013.01); *G11C 11/406* (2013.01); *G11C 11/4087* (2013.01); *G11C 29/42* (2013.01); *G11C 2211/4062* (2013.01)

(58) Field of Classification Search
CPC .. G06F 11/1068; G06F 11/106; G11C 11/406; G11C 11/4087; G11C 29/42; G11C 2211/4062
See application file for complete search history.

(56) References Cited

U.S. PATENT DOCUMENTS

| | | | |
|---|---|---|---|
| 6,002,632 | A | 12/1999 | Krueger |
| 10,810,079 | B2 | 10/2020 | Halbert et al. |

(Continued)

FOREIGN PATENT DOCUMENTS

| | | | |
|---|---|---|---|
| CN | 106941011 | A | 7/2017 |
| CN | 108122587 | A | 6/2018 |

OTHER PUBLICATIONS

Chinese patent office, "CN Office Action" issued in connection with China Patent Application No. 202110219629.5 dated Dec. 14, 2023 (7 pages) (2 pages of English Translation and 5 pages of Original Document).

*Primary Examiner* — John J Tabone, Jr.

(57) ABSTRACT

Methods, systems, and apparatuses for a memory device (e.g., DRAM) including an error check and scrub (ECS) procedure in conjunction with refresh operations are described. The ECS procedure may include read/modify-write cycles when errors are detected in code words. In some embodiments, the memory device may complete the ECS procedure over multiple refresh commands, namely by performing a read (or read/modify) portion of the ECS procedure while a first refresh command is executed, and by performing a write portion of the ECS procedure while a second refresh command is executed. The ECS procedure described herein may facilitate avoiding signaling conflicts or interferences that may occur between the ECS procedure and other memory operations.

15 Claims, 7 Drawing Sheets

(56) References Cited

U.S. PATENT DOCUMENTS

| | | | | |
|---|---|---|---|---|
| 10,817,371 | B2 * | 10/2020 | Rooney | G11C 29/52 |
| 11,221,913 | B2 * | 1/2022 | Rooney | G06F 11/1068 |
| 11,687,410 | B2 * | 6/2023 | Rooney | G11C 11/406 714/764 |
| 12,056,008 | B2 * | 8/2024 | Rooney | G11C 11/4087 |
| 2006/0048031 | A1 | 3/2006 | Aadsen et al. | |
| 2017/0068584 | A1 | 3/2017 | Park et al. | |
| 2017/0139771 | A1 | 5/2017 | Chung et al. | |
| 2017/0192845 | A1 | 7/2017 | Kim et al. | |
| 2018/0150350 | A1 | 5/2018 | Cha et al. | |
| 2018/0322008 | A1 * | 11/2018 | Chung | G06F 3/0679 |
| 2019/0073261 | A1 * | 3/2019 | Halbert | G06F 3/0679 |
| 2019/0243708 | A1 | 8/2019 | Cha et al. | |
| 2020/0210278 | A1 * | 7/2020 | Rooney | G06F 11/1004 |
| 2020/0401476 | A1 * | 12/2020 | Cha | G06F 11/076 |
| 2021/0064462 | A1 | 3/2021 | Eun et al. | |
| 2021/0286670 | A1 * | 9/2021 | Rooney | G06F 11/1068 |
| 2022/0129348 | A1 * | 4/2022 | Rooney | G06F 11/106 |
| 2024/0004755 | A1 * | 1/2024 | Rooney | G06F 11/106 |
| 2024/0370336 | A1 * | 11/2024 | Rooney | G06F 11/106 |

* cited by examiner

ERROR CHECK AND SCRUB FOR SEMICONDUCTOR MEMORY DEVICE

CROSS-REFERENCE TO RELATED APPLICATIONS

This application is a continuation of U.S. application Ser. No. 18/195,374, filed May 10, 2023, which is a continuation of U.S. application Ser. No. 17/571,189, filed Jan. 7, 2022, which is a continuation of U.S. application Ser. No. 16/816,024, filed Mar. 11, 2020, now U.S. Pat. No. 11,221,913; each of which is incorporated herein by reference in its entirety.

TECHNICAL FIELD

The present disclosure generally relates to a memory device, and more specifically, relates to error check and scrub for a semiconductor memory device.

BACKGROUND

Memory devices are widely used to store information related to various electronic devices such as computers, wireless communication devices, cameras, digital displays, and the like. Memory devices may be volatile or non-volatile and can be of various types, such as magnetic hard disks, random access memory (RAM), read only memory (ROM), dynamic RAM (DRAM), synchronous dynamic RAM (SDRAM), and others. Information is stored in various types of RAM by charging a memory cell to have different states. Improving RAM memory devices, generally, can include increasing memory cell density, increasing read/write speeds or otherwise reducing operational latency, increasing reliability, increasing data retention, reducing power consumption, or reducing manufacturing costs, among other metrics.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
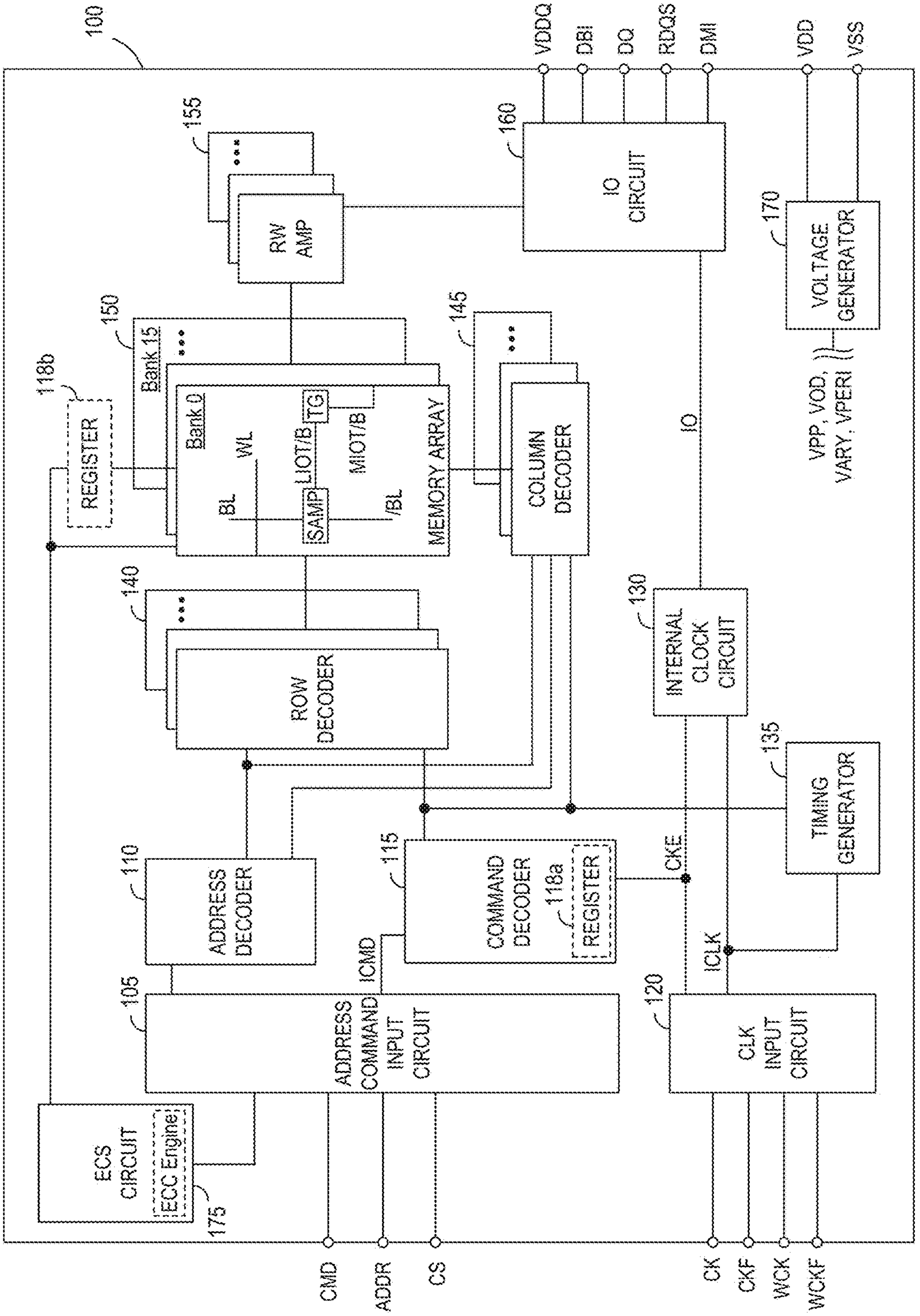
FIG. 1 illustrates a simplified block diagram schematically illustrating a memory device in accordance with an embodiment of the present technology.

Methods, systems, and apparatuses for memory devices (e.g., DRAM) are disclosed, which include an error check and scrub (ECS) procedure that may be performed concurrently or in conjunction with other operations (e.g., refresh operations). The described ECS procedure may be regarded as a background operation that the memory devices perform because the memory devices may perform the ECS procedure while carrying out other operations (foreground operations). Also, the described ECS procedure may be referred to as an automatic ECS mode because the memory devices may spontaneously perform the ECS procedure—e.g., without receiving, from a host device coupled with the memory devices, a command directed to performing the ECS procedure. Such a background operation that the memory devices perform may be beneficial in several aspects, for example, to reduce power consumption of the system including the memory devices (e.g., when using an on-die error correction code (ECC) engine such that energy associated with data traveling to/from the host device for the ECS procedure may be reduced), to enhance production yield of the memory devices (e.g., by reducing and maintaining bit error rates below a threshold using the ECS procedure), to improve bandwidths of the memory devices (e.g., by making certain resources (e.g., interfaces and/or buses) available to other operations of the memory devices, and the like.

Some semiconductor memory devices, such as DRAM, store information as charge accumulated in cell capacitors ("cells"), with the cells organized into rows. The charge accumulated in the cell capacitors may escape from the cell capacitor (which may be referred to as "leakage") to surrounding components connected to the cell capacitor (e.g., metal lines, semiconductor junctions of switching transistors), due to a voltage difference between the capacitor and the surrounding components, in some cases. Certain instances of leakage may be exacerbated when a row of memory cells experiences "row hammering," which refers to a row of memory cells being repeatedly driven to an active level within a certain duration (e.g., over a duration less than that between sequential refresh operations). Row hammering may accelerate leakage in memory cells coupled with one or more rows (which may be referred to as victim rows) that are adjacent to the row experiencing the row hammering.

A refresh operation, which may be initiated in response to a refresh command issued to the memory device or triggered by a measure of mitigating row hammering issues, or other circumstances, can correct for leakage in a row of memory cells (a memory row), preventing the information from being lost. In some embodiments, a refresh operation includes an operation activating (opening) a memory row (e.g., Activate command), which senses or "reads" the information stored in a memory row. As a result of Activate command, the memory cells coupled with the memory row may be refreshed (e.g., establishing full or nearly full cell charges corresponding to either logic 1 or logic 0 status). The refresh operation also includes another operation deactivating the open memory row (e.g., Precharge command), in some embodiments. Thus, refresh operations can help prevent bit errors by renewing cell charges before they degrade to a point where the charge level no longer corresponds to the original stored bit value.

In some embodiments, a refresh command may be issued to the memory device regularly—e.g., every refresh interval time (t_REFI)—to limit an amount of leakage within a certain level correlated to the refresh interval time. Further, a refresh command may be associated with a duration (e.g., t_RFC), during which the refresh command is executed. In some embodiments, durations associated with refresh commands may be determined based on a memory capacity of the memory device and a quantity of memory cells to be refreshed in response to the refresh command—e.g., a first duration correlated to refreshing memory cells of one or more memory rows of all banks of the memory array, a second duration correlated to refreshing memory cells of one or more memory rows of a single bank of the memory array, etc.

Refresh operations, however, do not correct errors that may occur if a cell's charge has changed enough that the charge is interpreted as a wrong logic value (i.e., the bit has "flipped" from a correct logic value, resulting in a bit "flip" error or bit error). In some cases, memory devices may be configured to perform an ECC function (e.g., using an on-die ECC engine or ECC circuit) that can detect and correct one or more errors in data stored in the memory array (e.g., a code word). In some cases, however, checking for and correcting such errors (i.e., ECS procedure) may be delayed until the memory device is accessed, e.g., during a read operation, to avoid an overhead associated with performing the ECS procedure alone. This delay, however, can increase the likelihood of having a quantity of errors in the data (e.g., the code word) that exceeds the correction capacity of the ECC function. Accordingly, in some embodiments, the memory device may incorporate the ECS procedure into refresh operations—i.e., a memory device may perform the ECS procedure (as a background operation) concurrently or in conjunction with refresh operations (as a foreground operation). Performing an ECS procedure during a refresh operation provides greater opportunity for discovering bit flip errors before they are compounded by additional bit flips beyond the correction capacity of the ECC function.

In some cases, however, an ECS procedure for a group of code words (e.g., 128 code words associated with a memory row) may take a certain duration—e.g., reading a code word from an address of an activated memory row, detecting and correcting an error in the code word, and storing the corrected code word back to the address (which may be collectively referred to as a read-modify-write cycle), and moving on to a next address of the activated memory row until the entire code words of the group (e.g., 128 code words) are checked for errors and corrected if necessary. When the duration of performing the ECS procedure (a background operation) exceeds a time window (e.g., a time window or a duration related to t_RFC) associated with a refresh command (a foreground operation), a signaling conflict or interference may occur between the ECS procedure and other memory operations that may be initiated subsequently to the refresh command.

By way of example, a refresh command may refresh all code words of a specific row of all banks of a memory array (e.g., one row per bank for all banks of a memory array)—e.g., a REF_ab command. Such a refresh command may include a time window (e.g., a duration of approximately 300 nsec for a 16 Gb memory array) that may be enough to perform at least one ECS procedure for the code words. In other cases, a refresh command may be associated with refreshing all code words of a row of a single bank of a memory group of the memory array—e.g., a REF_sb command. Such a refresh command may include a shorter time window (e.g., a duration of approximately 100 nsec or less for the 16 Gb memory array) that may be insufficient to perform at least one ECS procedure for the code words. Accordingly, an ECS procedure incorporated into a refresh command associated with a relatively shorter time window (e.g., the REF_sb command) may result in signaling conflicts and/or interferences with operations that could occur in other banks within the bank group. As such, the ECS procedure may be segmented into two or more portions such that each portion of the ECS procedure may be completed within a time window associated with a refresh command (e.g., the REF_sb command) such that the memory device may avoid the signaling conflicts and/or interferences that may occur otherwise.

In some embodiments, the memory device may perform a first portion of an ECS procedure that may include reading (retrieving) a code word from an address (a target scrub address) of a row of memory cells that has been activated in response to a first refresh command (e.g., a first REF_sb command). In addition, the memory device may send the retrieved code word to an ECC engine (e.g., an on-die ECC engine) configured to check for an error in the code word. The ECC engine may correct one or more errors if discovered (i.e., modify the code word) and store the outcome of correction (i.e., a corrected code word and associated parity bits) in one or more registers (e.g., ECS registers). In some embodiments, the memory device may write a register with an indication (e.g., setting a flag) that the code word has been corrected. In this manner (i.e., without performing writing the corrected code word at the address), the memory device may complete the first portion of the ECS procedure (e.g., an ECS-read portion) before a time window of the first refresh command expires to avoid the signaling conflicts and/or interferences.

In some embodiments, the first portion of the ECS procedure (e.g., an ECS-read/modify portion) may include the modifying function (e.g., checking for errors in the code word, correcting the errors if discovered, storing the corrected code word in the ECS registers, or a combination thereof) if the memory device is configured to facilitate the modifying function within the time window of the first refresh command—e.g., the ECC engine may be configured to handle a large quantity of code words (i.e., multiple code words) read from the row simultaneously. In some embodiments, the memory device may perform the modifying function (or some aspects of the modifying function) outside the time window of the first refresh command—e.g., the ECC engine may be configured to handle a few code words read from the row at a time. When the code word includes no error, then the first portion of the ECS procedure does not include the modifying function.

The memory device may perform a second portion of the ECS procedure (e.g., an ECS-write portion) in response to a second refresh command (e.g., a second REF_sb command) directed to the same bank as the first refresh command. The second portion of the ECS procedure may vary depending on whether writing the corrected code word at the target scrub address is desired or not. For example, when no error has been detected in the code word read during the first portion of the ECS procedure (e.g., the ECS-read portion), the memory device does not need to perform the second portion of the ECS procedure (e.g., the ECS-write portion)—e.g., the memory device may proceed to perform the first portion of the ECS procedure (e.g., the ECS-read portion) at a different row of the same bank.

When at least one error has been detected and corrected, however, the memory device may further determine whether a write command has been performed at the target scrub address since the first refresh command has been completed (or any time prior to receiving the second refresh command). If at least one write command has been performed at the target scrub address (i.e., the target scrub address may include a different code word as a result of the write command), then the memory device may not perform the ECS-write portion because the corrected code word stored in the ECS registers may be no longer valid for the target scrub address. If no write command has been performed at the target scrub address since the first refresh command has been completed, then the memory device may perform the ECS-write portion to write at the target scrub address the corrected code word while the second refresh command is being executed. In this manner (i.e., having performed reading and checking for errors in the code words), the memory device may complete the second portion of the ECS procedure (e.g., the ECS-write portion) before a time window of the second refresh command expires to avoid the signaling conflicts and/or interferences.

Accordingly, the first portion (e.g., the ECS-read portion, the ECS-read/modify portion) and the second portion (e.g., the ECS-write portion) of the ECS procedure may be combined over two refresh commands (e.g., two REF_sb commands) to perform the ECS procedure in its entirety for the code words associated with the refresh commands (e.g., code words of the row in the bank aimed to be refreshed with the REF_sb commands) without incurring the signaling conflicts and/or interferences with other operations within the same bank group.

FIG. 1 illustrates a simplified block diagram schematically illustrating a memory device 100 in accordance with an embodiment of the present technology. The memory device 100 may include an array of memory cells, such as memory array 150. The memory array 150 may include a plurality of banks (e.g., banks 0-15 in the example of FIG. 1), and each bank may include a plurality of word lines (WL), a plurality of bit lines (BL), and a plurality of memory cells arranged at intersections of the word lines and the bit lines. The selection of a word line WL may be performed by a row decoder 140, and the selection of a bit line BL may be performed by a column decoder 145. Sense amplifiers (SAMP) may be provided for corresponding bit lines BL and connected to at least one respective local I/O line pair (LIOT/B), which may in turn be coupled to at least one respective main I/O line pair (MIOT/B), via transfer gates (TG), which can function as switches.

The memory device 100 may employ a plurality of external terminals that include command and address terminals coupled to a command bus and an address bus to receive command signals CMD and address signals ADDR, respectively. The memory device may further include a chip select terminal to receive a chip select signal CS, clock terminals to receive clock signals CK and CKF, data clock terminals to receive data clock signals WCK and WCKF, data terminals DQ, RDQS, DBI (for data bus inversion function), and DMI (for data mask inversion function), power supply terminals VDD, VSS, VDDQ, and VSSQ, and on-die termination terminal(s) ODT.

The command terminals and address terminals may be supplied with an address signal and a bank address signal from outside. The address signal and the bank address signal supplied to the address terminals can be transferred, via a command/address input circuit 105, to an address decoder 110. The address decoder 110 can receive the address signals and supply a decoded row address signal (XADD) to the row decoder 140, and a decoded column address signal (YADD) to the column decoder 145. The address decoder 110 can also receive the bank address portion of the ADDR input and supply the decoded bank address signal (BADD) and supply the bank address signal to both the row decoder 140 and the column decoder 145.

The command and address terminals may be supplied with command signals CMD, address signals ADDR, and chip select signals CS, from a memory controller. The command signals may represent various memory commands from the memory controller (e.g., including access commands, which can include read commands and write commands). The select signal CS may be used to select the memory device 100 to respond to commands and addresses provided to the command and address terminals. When an active CS signal is provided to the memory device 100, the commands and addresses can be decoded and memory operations can be performed. The command signals CMD may be provided as internal command signals ICMD to a command decoder 115 via the command/address input circuit 105. The command decoder 115 may include circuits to decode the internal command signals ICMD to generate various internal signals and commands for performing memory operations, for example, a row command signal to select a word line and a column command signal to select a bit line. The internal command signals can also include output and input activation commands, such as clocked command CMDCK (not shown in FIG. 1).

The command decoder 115, in some embodiments, may further include one or more registers **118*a* for tracking various counts or values (e.g., counts of refresh commands received by the memory device 100 or self-refresh operations performed by the memory device 100). In some embodiments, a subset of registers 118*a*** may be referred to as mode registers and configured to store user-defined variables to provide flexibility in performing various functions, features, and modes. For example, the memory device may receive a signaling from a host device at the mode registers indicating whether an ECC mode of the memory device is enabled or disabled.

In some embodiments, the memory device 100 may include an ECS circuit 175. The ECS circuit 175 may include an ECC engine, in some cases. The ECS circuit (in conjunction with the address/command input circuit 105) may be configured to receive refresh commands (e.g., from a host device or controller coupled with the memory device 100) directed to the memory array 150 and perform an ECS procedure. In some embodiments, the memory device 100 may perform the ECS procedure in an automatic ECS mode as a background operation. As set forth above, the ECS circuit may perform the ECS-read portion of the ECS procedure while a first refresh command is being executed. In some cases, the ECS circuit 175 may utilize the ECC engine to detect and correct (e.g., modify) one or more errors in a code word retrieved from the memory array 150. Further, the ECS circuit 175 may store the code word with the one or more errors corrected (i.e., a corrected code word) in one or more registers **118*b* (e.g., ECS registers). Additionally, the ECS circuit 175 may perform the ECS-write portion of the ECS procedure while a second refresh command is being executed. In some cases, the ECS circuit 175 may write the corrected code word back in the memory array 150. In other cases, the ECS circuit 175 may omit writing the corrected code word back in the memory array 150** as described in more detail herein.

When a read command is issued to a bank with an open row and a column address is timely supplied as part of the read command, read data can be read from memory cells in the memory array 150 designated by the row address (which may have been provided as part of the Activate command identifying the open row) and column address. The read command may be received by the command decoder 115, which can provide internal commands to input/output circuit 160 so that read data can be output from the data terminals DQ, RDQS, DBI, and DMI via read/write amplifiers 155 and the input/output circuit 160 according to the RDQS clock signals. The read data may be provided at a time defined by read latency information RL that can be programmed in the memory device 100, for example, in a mode register (e.g., the register 118*a*). The read latency information RL can be defined in terms of clock cycles of the CK clock signal. For example, the read latency information RL can be a number of clock cycles of the CK signal after the read command is received by the memory device 100 when the associated read data is provided.

When a write command is issued to a bank with an open row and a column address is timely supplied as part of the write command, write data can be supplied to the data terminals DQ, DBI, and DMI according to the WCK and WCKF clock signals. The write command may be received by the command decoder 115, which can provide internal commands to the input/output circuit 160 so that the write data can be received by data receivers in the input/output circuit 160, and supplied via the input/output circuit 160 and the read/write amplifiers 155 to the memory array 150. The write data may be written in the memory cell designated by the row address and the column address. The write data may be provided to the data terminals at a time that is defined by write latency WL information. The write latency WL information can be programmed in the memory device 100, for example, in the mode register (e.g., register 118*a*). The write latency WL information can be defined in terms of clock cycles of the CK clock signal. For example, the write latency information WL can be a number of clock cycles of the CK signal after the write command is received by the memory device 100 when the associated write data is received.

The power supply terminals may be supplied with power supply potentials VDD and VSS. These power supply potentials VDD and VSS can be supplied to an internal voltage generator circuit 170. The internal voltage generator circuit 170 can generate various internal potentials VPP, VOD, VARY, VPERI, and the like based on the power supply potentials VDD and VSS. The internal potential VPP can be used in the row decoder 140, the internal potentials VOD and VARY can be used in the sense amplifiers included in the memory array 150, and the internal potential VPERI can be used in many other circuit blocks.

The power supply terminal may also be supplied with power supply potential VDDQ. The power supply potential VDDQ can be supplied to the input/output circuit 160 together with the power supply potential VSS. The power supply potential VDDQ can be the same potential as the power supply potential VDD in an embodiment of the present technology. The power supply potential VDDQ can be a different potential from the power supply potential VDD in another embodiment of the present technology. However, the dedicated power supply potential VDDQ can be used for the input/output circuit 160 so that power supply noise generated by the input/output circuit 160 does not propagate to the other circuit blocks.

The on-die termination terminal(s) may be supplied with an on-die termination signal ODT. The on-die termination signal ODT can be supplied to the input/output circuit 160 to instruct the memory device 100 to enter an on-die termination mode (e.g., to provide one of a predetermined number of impedance levels at one or more of the other terminals of the memory device 100).

The clock terminals and data clock terminals may be supplied with external clock signals and complementary external clock signals. The external clock signals CK, CKF, WCK, WCKF can be supplied to a clock input circuit 120. The CK and CKF signals can be complementary, and the WCK and WCKF signals can also be complementary. Complementary clock signals can have opposite clock levels and transition between the opposite clock levels at the same time. For example, when a clock signal is at a low clock level a complementary clock signal is at a high level, and when the clock signal is at a high clock level the complementary clock signal is at a low clock level. Moreover, when the clock signal transitions from the low clock level to the high clock level the complementary clock signal transitions from the high clock level to the low clock level, and when the clock signal transitions from the high clock level to the low clock level the complementary clock signal transitions from the low clock level to the high clock level.

Input buffers included in the clock input circuit 120 can receive the external clock signals. For example, when enabled by a CKE signal from the command decoder 115, an input buffer can receive the CK and CKF signals and the WCK and WCKF signals. The clock input circuit 120 can receive the external clock signals to generate internal clock signals ICLK. The internal clock signals ICLK can be supplied to an internal clock circuit 130. The internal clock circuit 130 can provide various phase and frequency controlled internal clock signal based on the received internal clock signals ICLK and a clock enable signal CKE from the command decoder 115. For example, the internal clock circuit 130 can include a clock path (not shown in FIG. 1) that receives the internal clock signal ICLK and provides various clock signals to the command decoder 115. The internal clock circuit 130 can further provide input/output (IO) clock signals. The IO clock signals can be supplied to the input/output circuit 160 and can be used as a timing signal for determining an output timing of read data and the input timing of write data. The IO clock signals can be provided at multiple clock frequencies so that data can be output from and input to the memory device 100 at different data rates. A higher clock frequency may be desirable when high memory speed is desired. A lower clock frequency may be desirable when lower power consumption is desired. The internal clock signals ICLK can also be supplied to a timing generator 135 and thus various internal clock signals can be generated.

Memory devices such as the memory device 100 of FIG. 1 can be configured to perform an ECS procedure, as background operations in an automatic ECS mode, on portions of the memory array 150 in response to receiving refresh commands from a connected host device or memory controller. As set forth herein, when the memory device 100 receives a first refresh command directed to a bank of memory cells (e.g., the bank 0 of memory array 150), the memory device 100 can, in response to receiving the first refresh command, activate a target row of the bank of memory cells and retrieve data from the target row, the data including a code word. The code word may correspond to an address associated with the target row that may be configured with a set of addresses including the address of the code word.

Subsequently, the memory device 100 (e.g., the ECS circuit 175) may detect and correct one or more errors in the code word of the retrieved data. In some embodiments, the memory device 100 may utilize an ECC circuit (e.g., the ECC engine included in the ECS circuit 175) to detect and correct the one or more errors. In some cases, the ECC circuit may be configured to concurrently perform the ECC function on multiple code words. The memory device 100 may store the code word with the one or more errors corrected (a corrected code word) in one or more registers (e.g., the registers 118*b*). Such registers may be configured to store multiple code words that each have been corrected for errors detected in the code words. In some cases, the memory device 100 may not detect any error in the code word. The memory device 100 may deactivate the target row of the bank (e.g., via Precharge command) as the memory device 100 completes operations associated with the first refresh command.

When the memory device 100 receives a second refresh command directed to the bank of memory cells (e.g., the bank 0 of memory array 150), the memory device 100 can, in response to receiving the second refresh command, activate the target row of the bank and write at the address the corrected code word stored in the one or more registers (e.g., the register 118*b*). In this regard, the memory device 100 (e.g., the ECS circuit 175) may have determined that no write command has been executed at the address before receiving the second refresh command. On the contrary, when the memory device 100 (e.g., the ECS circuit 175) determines that at least one write command has been executed at the address before receiving the second refresh command, the memory device 100 (e.g., the ECS circuit 175) may omit writing the corrected code word at the address. The memory device 100 may deactivate the target row of the bank (e.g., via Precharge command) as the memory device 100 completes operations associated with the second refresh command.

Figure 2:
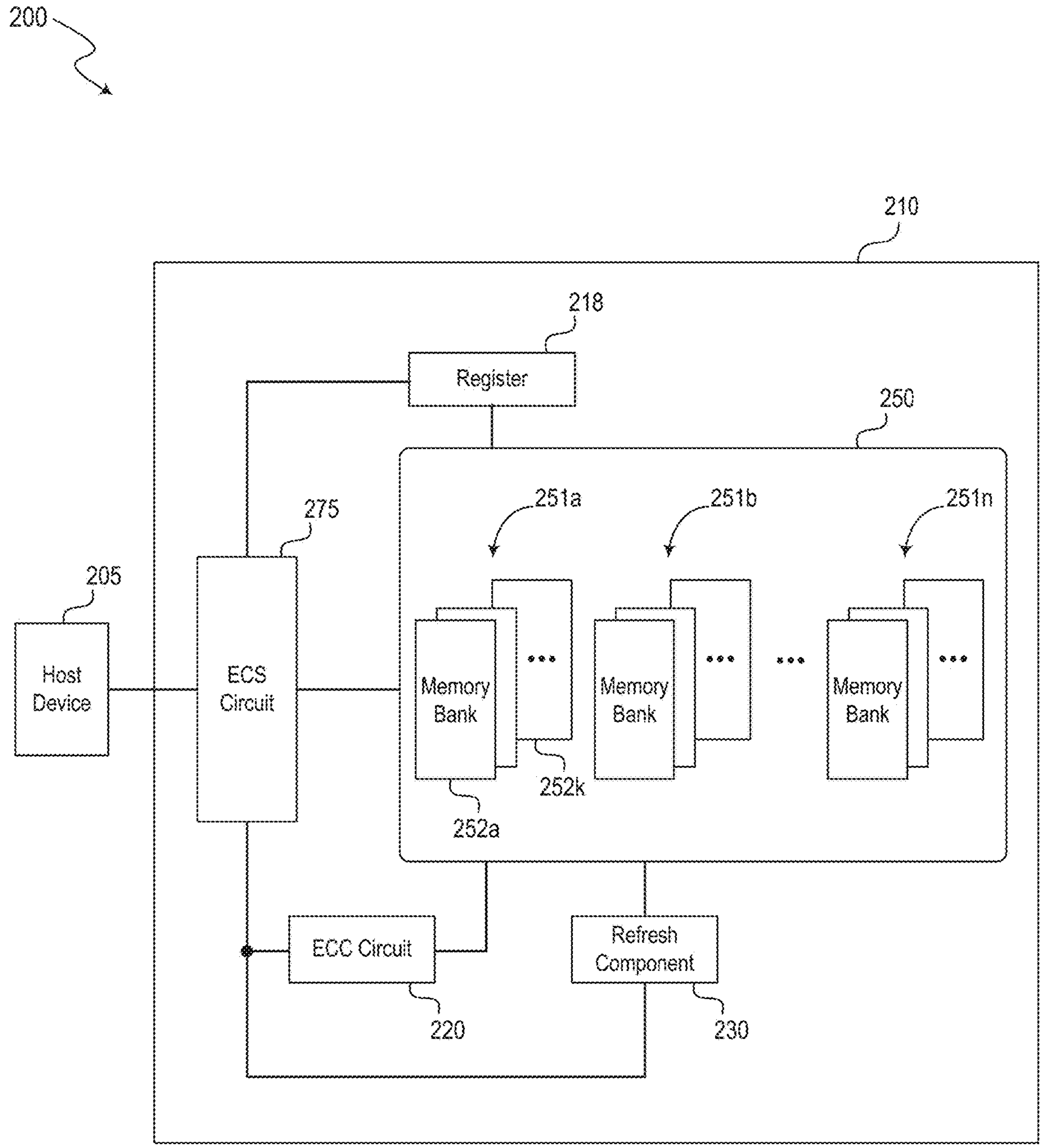
FIG. 2 is a simplified block diagram of an example memory device illustrating various components for performing an error check and scrub (ECS) procedure in accordance with an embodiment of the present disclosure.

FIG. 2 is a block diagram 200 schematically illustrating a memory device 210 in accordance with an embodiment of the present technology. The block diagram 200 also illustrates a host device 205 coupled with the memory device 210. The memory device 210 may be an example of or include aspects of the memory device 100 described with reference to FIG. 1. The memory device 210 may include an ECS circuit 275 (which may be an example of or include aspects of the ECS circuit 175), one or more registers 218 (which may be an example of or include aspects of the registers 118), an ECC circuit 220 (which may be an example of or include aspects of the ECC engine described with reference to FIG. 1), a refresh component 230, and a memory array 250 (which may be an example of or include aspects of the memory array 150). Further, the ECC circuit 220 may be configured to concurrently perform the ECC function on one or more code words. Also, the one or more registers 218 may be configured to store one or more code words that each have been corrected for errors detected in the code words.

The memory array 250 may be configured to include a quantity of bank groups 251 (e.g., bank groups 251*a* through 251*n*). Each individual bank group 251 may include a set of banks of memory cells (e.g., banks 252*a* through 252*k* in the bank group 251*a*). Each individual bank of memory cells (e.g., the bank 252*a*) may include a set of rows, where each row includes a set of addresses that each may correspond to a code word. For example, a row may include 128 addresses that each correspond to a code word with eight (8) bytes. That is, the row may include 1,024 bytes of data, in this example.

The refresh component 230 may be configured to control various aspects of refresh commands that the memory device 210 may receive from the host device 205. In some embodiments, the refresh component 230 may maintain a quantity of counters that each may identify one or more rows of individual banks to perform refresh operations upon receiving a refresh command from the host device 205. For example, one of such counters of the refresh component 230 may be associated with the bank 252*a* and indicate a row 25 out of 1,024 rows that the bank 252*a* may include. When the memory device 210 receive a refresh command (e.g., a first REF_sb command) directed to the bank 252*a*, the refresh component 230 may perform refresh operations (e.g., Activate command, Precharge command) on the row 25 based on the information in the counter. The refresh component 230 may, upon completing the refresh command, update the counter to indicate a next row (e.g., a row 26, a row different than the row 25) such that a next refresh command (e.g., a second REF_sb command) directed to the bank 252*a* may be executed on the next row (e.g., the row 26, the row different than the row 25), and so on. In this manner, the refresh component 230 may facilitate evenly distributing refresh operations across all rows of individual banks (e.g., the bank 252*a*) to avoid a subset of rows violating a refresh cycle requirement. Further, the refresh component 230 may maintain another set of counters (or as part of the quantity of counters) as part of the quantity of counters, which may identify one or more banks of the memory array 250 to perform refresh operations.

The ECS circuit 275 may perform ECS procedures, in some cases, in conjunction with the refresh component 230. In this regard, the ECS circuit 275 may control aspects of operations that the refresh component 230 performs and/or operate independent of the refresh component 230. For example, the ECS circuit 275 may perform a first portion of the ECS procedure (e.g., the ECS-read portion) that may be incorporated into a first refresh command (e.g., a first REF_sb command) aimed to refresh a row (e.g., the row 25 as indicated by the counter of the refresh component 230). The ECS circuit 275, may detect (and correct) an error in a code word from the row while the first refresh command is executed. The ECS circuit 275 may identify the address of the code word with the error as a target scrub address and store the code word with the error corrected (a corrected code word) in the one or more registers 218 (e.g., ECS registers).

Upon receiving a second refresh command (e.g., a second REF_sb command) and determining that no write command has been executed to the target scrub address since the first refresh command has been completed, the ECS circuit 275 may, in conjunction with the refresh component 230 in some cases, activate the row including the target scrub address (e.g., the row 25) to perform a second portion of the ECS procedure (e.g., the ECS-write portion) such that the ECS circuit 275 may write the corrected code word at the target scrub address. In some cases, the ECS circuit 275 may be configured to control certain counters of the refresh component 230 (e.g., as part of the quantity of counters of the refresh component 230) to keep track of the rows including one or more target scrub addresses. In some cases, the ECS circuit 275 may include a set of counters to keep track of the rows including one or more target scrub addresses, which may facilitate the ECS circuit 275 to operate independent of the refresh component 230.

In some cases, the ECS circuit 275 may identify that one or more rows of a bank (e.g., row 88 of the bank 252*a*) includes one or more code words that are more prone to the leakage than remaining rows of the bank—e.g., due to normal variations in process conditions, and maintain a list of target scrub addresses corresponding to such code words. The ECS circuit 275 may, in response to receiving a refresh command, determine to perform the ECS procedure on the target scrub addresses by activating one of the rows (e.g., the row 88) including the target scrub address, which may be different than the row that the refresh component 230 indicates to refresh next. In some cases, the ECS circuit 275 may identify victim rows (e.g., rows 111 and 113) of a bank upon determining that an adjacent row (e.g., row 112) of the bank has experienced the row hammering. The ECS circuit may, in response to receiving a refresh command, determine to perform the ECS procedure on one of the victim rows by activating one of the victim rows (e.g., row 111, row 113), which may be different than the row that the refresh component 230 indicates to refresh next.

In some embodiments, the ECS circuit 275 may be configured to receive, from the host device 205, a first refresh command (e.g., a first REF_sb command) directed to a bank of memory cells (e.g., memory cells of the bank 252*a* of the bank group 251*a*). The ECS circuit 275 may, in response to receiving the first refresh command, activate a target row of the bank of memory cells (e.g., the bank 252*a*) and retrieve data from the target row, where the data include a code word corresponding to an address associated with the target row (e.g., one of the 128 addresses of the target row, which may be referred to as a target scrub address). The ECS circuit 275 may detect at least one error in the code word using the ECC circuit 220. Further, the ECS circuit 275 may correct the at least one error in the code word using the ECC circuit 220 based on detecting the at least one error. Upon correcting the at least one error in the code word, the ECS circuit 275 may write a register (e.g., the register 118*a*, the register 118*b*, the register 218) with an indication that the code word has been corrected. In some embodiments, the ECS circuit 275 may set a flag to indicate that the code word has been corrected.

Moreover, the ECS circuit 275 may write (e.g., store) the data that include the code word with the at least one error corrected (i.e., a corrected code word) in one or more registers 218 (e.g., ECS registers) coupled with the memory array 250. In some embodiments, the one or more registers 218 may be configured to have a data dimension (e.g., a width of the ECS registers) corresponding to a first number of bits in the code word (e.g., sixty-four (64) bits in an 8-bytes long code word) and a second number of bits in a parity field (e.g., eight (8) bits) associated with the code word. In some cases, such configuration of the registers 218 facilitates the memory device 210 to perform the first portion of the ECS procedure (e.g., the ECS-read portion) in a similar manner as a normal read operation, but as a single step in process, such that the read portion of the ECS procedure may not interfere with operations that may occur in other banks (e.g., banks 252*b* through 252*k*) within the same bank group (e.g., the bank group 251*a*). In some embodiments, the ECS circuit 275 may deactivate the target row of the bank (e.g., Precharge command) before receiving a second refresh command (e.g., a second REF_sb command) from the host device 205.

In some embodiments, the ECS circuit 275 may determine whether one or more write commands have been executed to the address since the first refresh command has been completed. When the ECS circuit 275 determines that no write command has been executed to the address (e.g., the target scrub address), the ECS circuit 275 may, in response to receiving the second refresh command (e.g., the second REF_sb command directed to the bank 252*a*), activate the target row and write at the address the code word with the at least one error corrected (i.e., the corrected code word stored in the ECS registers). In contrast, when the ECS circuit 275 determines that one or more write commands have been executed to the address (e.g., the target scrub address) since the first refresh command has been completed, the ECS circuit 275 may not write at the address the corrected code word because the corrected code word may be no longer valid at the address.

Figure 3:
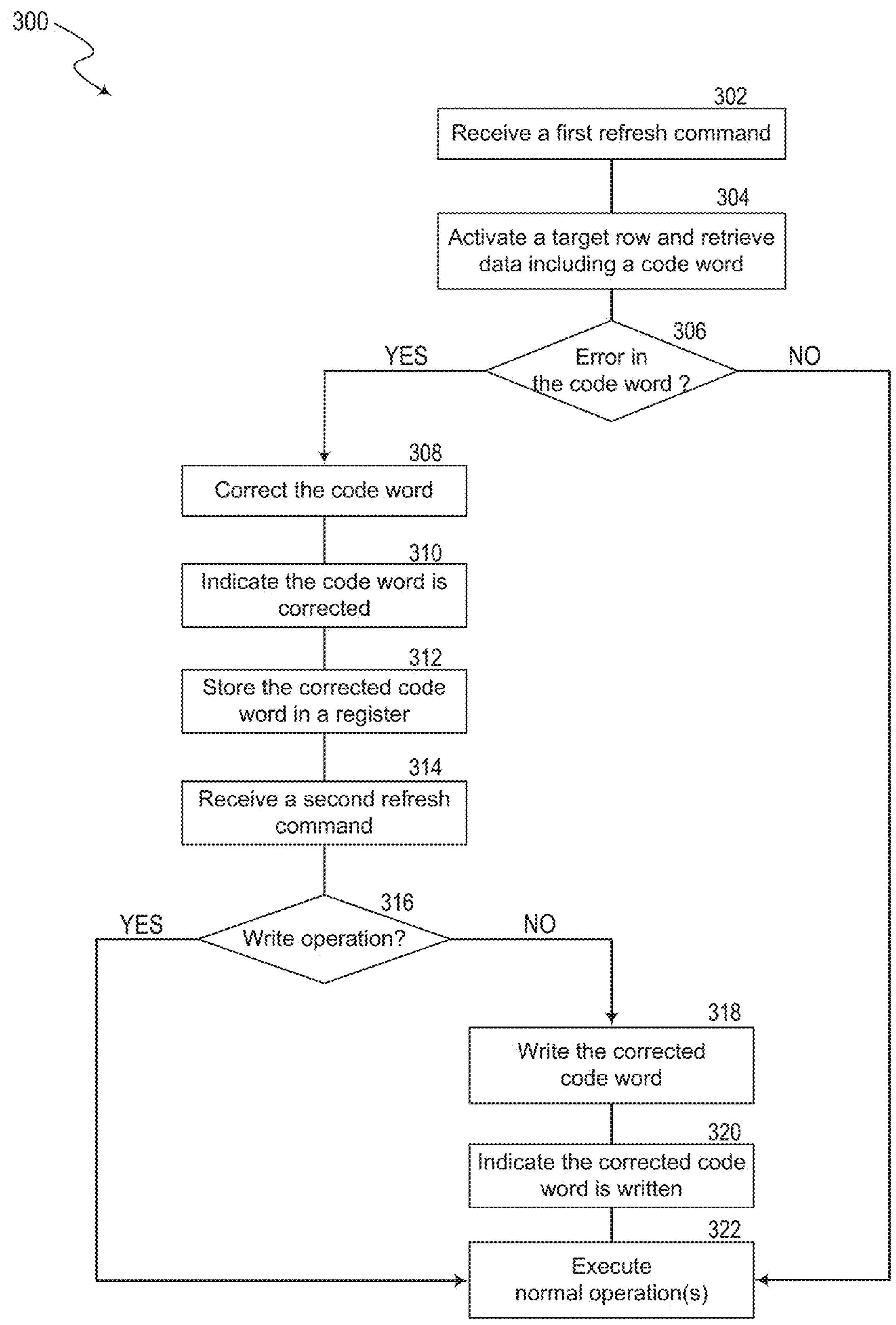
FIG. 3 is an example flow diagram for performing an ECS procedure in accordance with an embodiment of the present disclosure.

FIG. 3 is an example flow diagram 300 for illustrating an overall synopsis of a method of performing an ECS procedure in accordance with an embodiment of the present disclosure. The method may be an example of or include aspects of a method that a memory device (e.g., the memory device 100 or 210) may perform. Such a memory device (e.g., the memory device 100 or 210) may include an ECS circuit (e.g., the ECS circuit 175 or 275), an ECC engine (e.g., the ECC circuit 220), and a memory array (e.g., the memory array 150 or 250). The memory array may include a bank of memory cells (e.g., the bank 252*a* of the bank group 251*a*), where the bank of memory cells has a set of rows that each are associated with a set of addresses. Further, the memory device may maintain one or more registers (e.g., the registers 118, the registers 218, the ECS registers) configured to store a code word having at least one error corrected (i.e., a corrected code word). Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 302, the memory device can receive, from a host device or a controller coupled with the memory device, a first refresh command (e.g., a first REF_sb command) directed to a bank of memory cells (e.g., the bank 252*a*) that includes a set of rows. At block 304, the memory device may, in response to receiving the first refresh command, activate a target row (i.e., a row of the set of rows) of the bank of memory cells and retrieve data from the target row, where the data include a code word. The code word may correspond to an address (e.g., a target scrub address) associated with the target row.

At block 306, the memory device may determine whether the code word of the retrieved data includes at least one error. In some embodiments, the memory device may utilize the ECC engine to detect the at least one error in the code word. When the memory device determines that there is no error in the code word, the memory device may move on to the next address in the target row when the target row includes additional code words to check for errors. In some cases, the memory device may deactivate the target row to move on a next row when the first refresh command is configured to refresh more than one row (e.g., two or more target rows). In some cases, the memory device may proceed to execute normal operations as indicated at block 322 when the memory device completes checking for errors for code words in the target row.

At block 308, on the contrary, when the memory device detected the at least one error at block 306, the memory device (in conjunction with the ECC engine) may correct the at least one error in the code word. At block 310, the memory device may write a register (e.g., the registers 118, the registers 218) with an indication that the code word has been corrected—e.g., setting a flag (or an indication) to indicate that the code word has been corrected. At block 312, the memory device may write (e.g., store) the data that include the code word with the at least one error corrected (i.e., a corrected code word) in one or more registers (e.g., the registers 218, the ECS registers) coupled with the bank of memory cells.

In some embodiments, the memory device may be configured to repeat the steps including blocks 304 (e.g., retrieving data from the activated target row) through 312 until all code words of the activated target row are read, checked for errors and corrected if discovered. The steps including blocks 304 through 312 may be referred to as a first portion of an ECS procedure that includes a modifying function (e.g., checking for and correcting errors in the code words). In such embodiments, the first portion of the ECS procedure may be referred to as an ECS-read/modify portion. In some embodiments, the memory device may be configured to perform the ECS-read/modify portion before a time window associated with the first refresh command expires—e.g., the ECS-read/modify portion is incorporated into the first refresh command. In some embodiments, however, the memory device may be configured to read all code words of the activated target row during the first portion of the ECS procedure before the time window associated with the first refresh command expires, and perform the modifying function (e.g., checking for and correcting errors in the code words) or some aspects of the modifying function outside the time window associated with the first refresh command. In such embodiments, the first portion may be referred to as an ECS-read portion.

At block 314, the memory device may receive a second refresh command (e.g., a second REF_sb command) directed to the bank (e.g., the bank 252*a*). At block 316, the memory device may determine whether a write command has been executed to the address (e.g., the target scrub address) since the first refresh command for the target row has completed. If at least one write command has been executed to the address, the code word corresponding to the address may be different from the corrected code word stored in the one or more registers (e.g., the ECS registers)—i.e., the corrected code word may have become invalid for the address. As such, the memory device may not write the corrected code word at the address and may proceed to the next operation—e.g., executing normal operations as indicated at block 322.

On the contrary, if no write command has been executed to the address since completing the first refresh command for the target row, at block 318, the memory device may write the corrected code word at the address when the target row is activated in response to receiving the second refresh command. Subsequently, at block 320, the memory device may indicate that the corrected code word has been written (e.g., resetting the flag) based on writing the corrected code word at the address. In some embodiments, the memory device may be configured to repeat the steps including blocks 316 through 320 in response to receiving the second refresh command directed to the bank of memory cells (e.g., the bank 252*a*) until all code words of the target row that requires writing corrected code words. Subsequently, at block 322, the memory device may proceed to execute normal operations.

The steps including blocks 316 through 320 may be referred to as a second portion of the ECS procedure, which may be referred to as an ECS-write portion. The memory device may complete the second portion of the ECS procedure for all code words in the target row before the time window associated with the second refresh command expires—e.g., the ECS-write portion is incorporated into the second fresh command. In this manner, the memory device may complete a full ECS procedure over multiple (e.g., two as illustrated in the flow diagram 300) refresh commands—e.g., completing the ECS-read portion (or the ECS-read/modify portion) incorporated into a first refresh command, and completing the ECS-write portion incorporated into a second refresh command.

Figure 4:
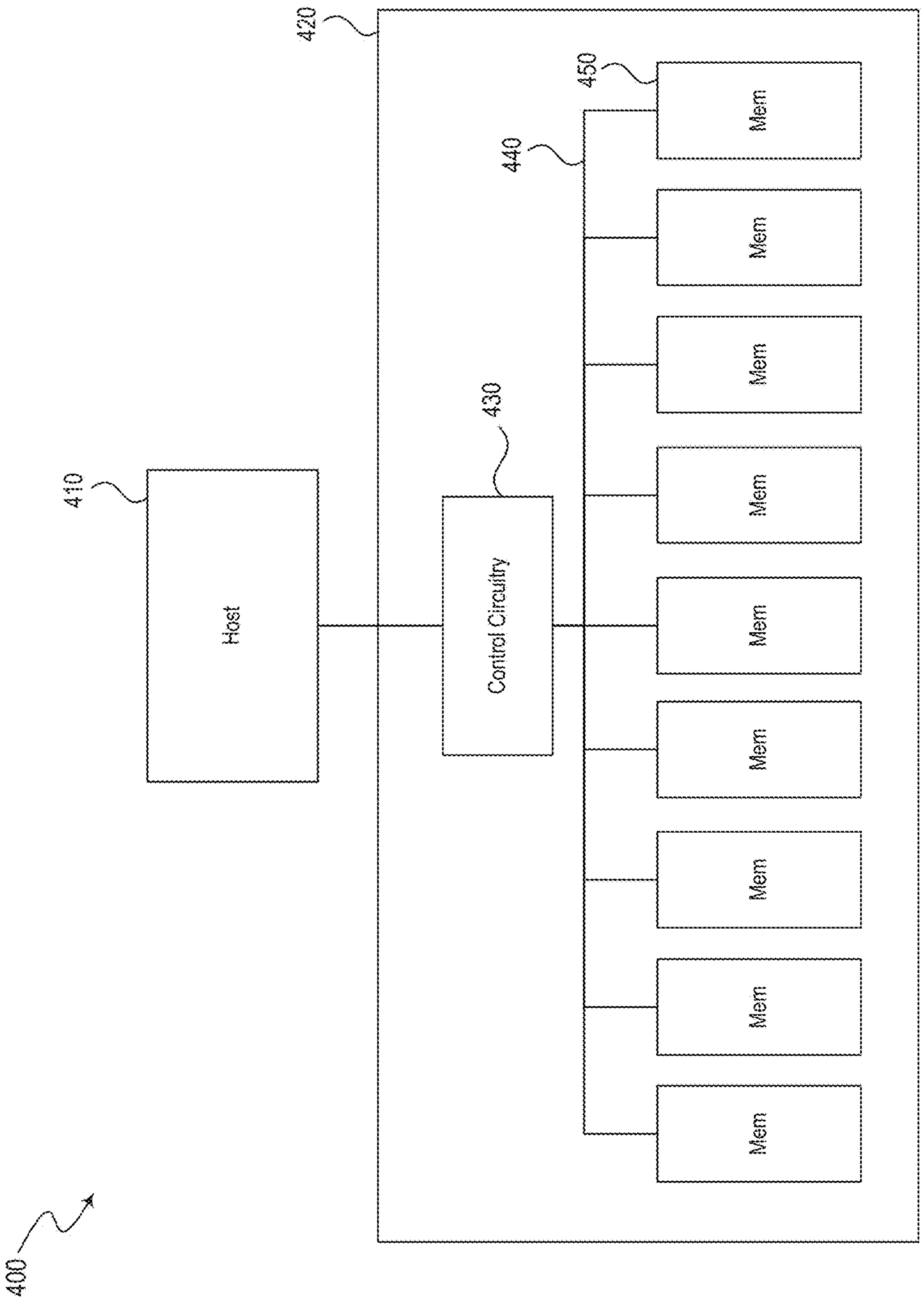
FIG. 4 is a simplified block diagram schematically illustrating an example memory system in accordance with an embodiment of the present disclosure.

FIG. 4 is a simplified block diagram schematically illustrating a memory system 400 in accordance with an embodiment of the present technology. Memory system 400 includes a host device 410 operably coupled to a memory module 420 (e.g., a dual in-line memory module (DIMM)). Memory module 420 can include controller circuitry 430 operably connected by a bus 440 to a plurality of memory devices 450. In accordance with one aspect of the present disclosure, the memory devices 450 can perform an ECS procedure while multiple (e.g., two) refresh operations are executed by the host device 410—e.g., performing a first portion (e.g., the ECS-read portion, the ECS-read/modify portion) of the ECS procedure incorporated into a first refresh command, and performing a second portion (e.g., the ECS-write portion) incorporated into a second refresh command.

Figure 5:
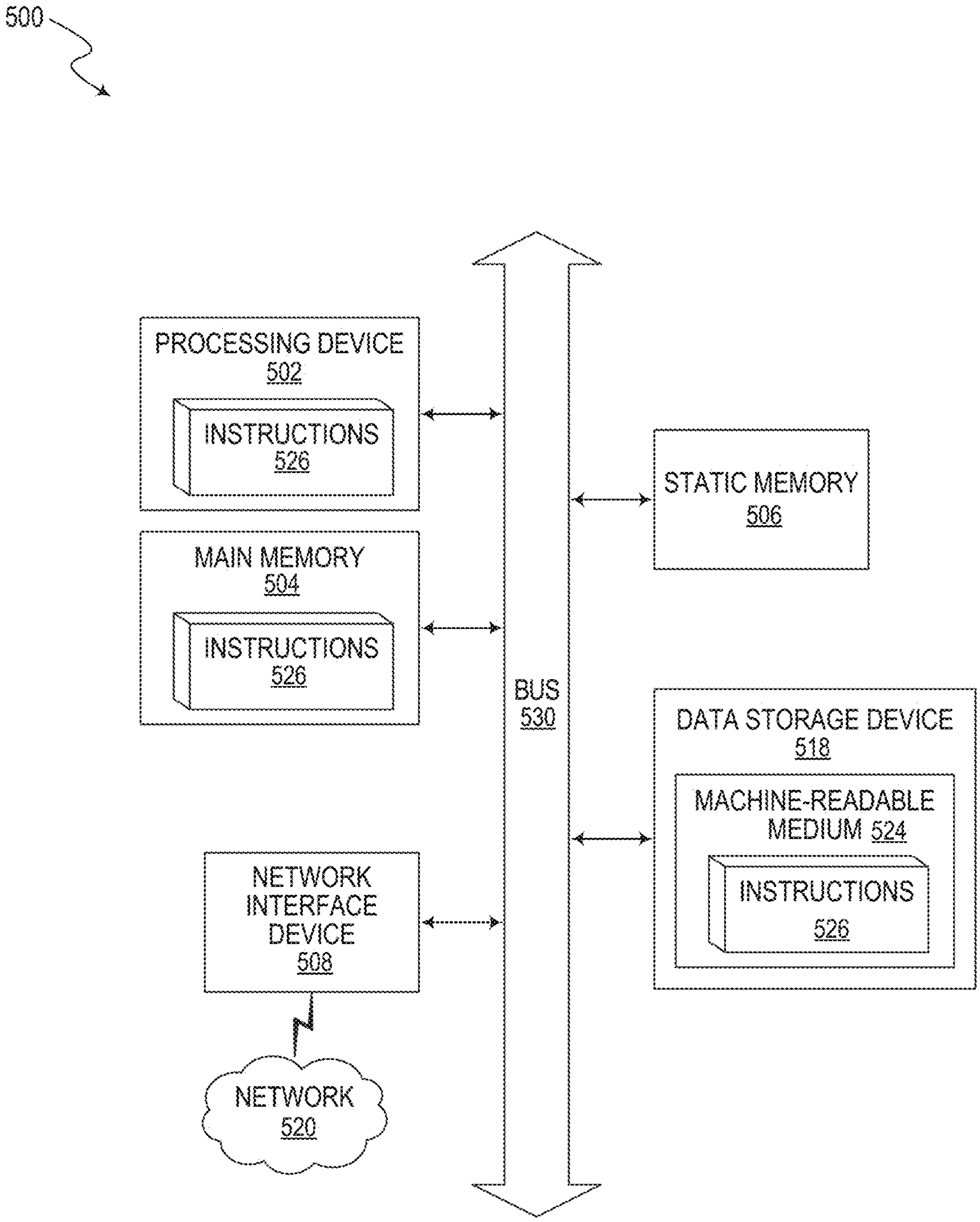
FIG. 5 is a block diagram of an example computer system in accordance with an embodiment of the present disclosure.

FIG. 5 illustrates an example machine of a computer system 500 within which a set of instructions, for causing the machine to perform any one or more of the methodologies discussed herein, can be executed. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530. In accordance with one aspect of the present disclosure, the main memory 504 can perform an ECS procedure over multiple refresh operations—e.g., performing a first portion (e.g., the ECS-read portion, the ECS-read/modify portion) of the ECS procedure in a background while a first refresh command is executed (i.e., the first portion of the ECS procedure is incorporated in the first refresh command), and performing a second portion (e.g., the ECS-write portion) in a background while a second refresh command is executed (i.e., the second portion of the ECS procedure is incorporated in the second refresh command).

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media.

While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Figure 6:
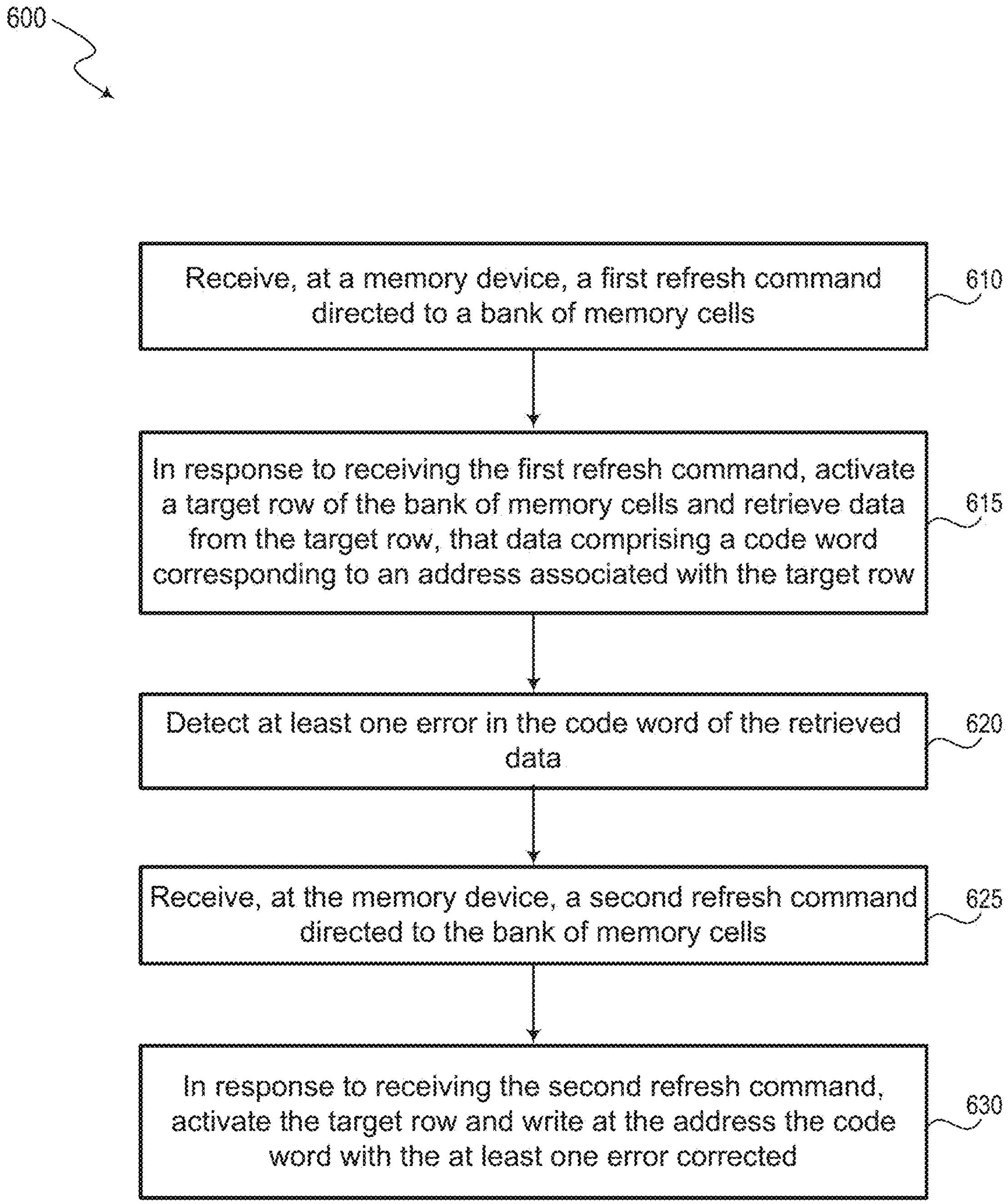
FIGS. 6 and 7 are flowcharts of methods for performing an ECS procedure in accordance with some embodiments of the present disclosure.

FIG. 6 is a flowchart 600 illustrating a method of operating a memory device in accordance with an embodiment of the present technology. The flowchart 600 may be an example of or include aspects of a method that the memory device 100 (or the ECS circuit 275) may perform as described with reference to FIGS. 1 through 5.

The method includes receiving, at the memory device, a first refresh command directed to a bank of memory cells (box 610). In accordance with one aspect of the present technology, the receiving feature of box 610 can be performed by an ECS circuit (e.g., the ECS circuit 175 or 275) and/or the command/address input circuit 105 as described with reference to FIGS. 1 through 5.

The method further includes, in response to receiving the first refresh command, activating a target row of the bank of memory cells and retrieving data from the target row, where the data comprise a code word corresponding to an address associated with the target row (box 615). In accordance with one aspect of the present technology, the activating and retrieving feature of box 615 can be performed by an ECS circuit (e.g., the ECS circuit 175 or 275) and/or the row decoder 140 and the column decoder 145 as described with reference to FIGS. 1 through 5.

The method further includes detecting at least one error in the code word of the retrieved data (box 620). In accordance with one aspect of the present technology, the detecting feature of box 620 can be performed by an ECS circuit (e.g., the ECS circuit 175 or 275) and/or the ECC circuit 220 as described with reference to FIGS. 1 through 5.

The method further includes receiving, at the memory device, a second refresh command directed to the bank of memory cells (box 625). In accordance with one aspect of the present technology, the receiving feature of box 625 can be performed by an ECS circuit (e.g., the ECS circuit 175 or 275) and/or the command/address input circuit 105 as described with reference to FIGS. 1 through 5.

The method further includes, in response to receiving the second refresh command, activating the target row and writing at the address the code word with the at least one error corrected (box 630). In accordance with one aspect of the present technology, the activating and writing feature of box 630 can be performed by an ECS circuit (e.g., the ECS circuit 175 or 275) and/or the row decoder 140 and the column decoder 145 as described with reference to FIGS. 1 through 5.

In some embodiments, the method may further include deactivating the target row of the bank of memory cells before receiving, at the memory device, the second refresh command. In some embodiments, the method may further include correcting the at least one error in the code word based on detecting the at least one error, where detecting and correcting the at least one error in the code word comprises using an ECC circuit of the memory device. In some embodiments, the method may further include writing a register with an indication that the code word has been corrected based on correcting the at least one error in the code word.

In some embodiments, the method may further include writing the data that include the code word with the at least one error corrected in one or more registers coupled with the bank of memory cells. In some embodiments, the method may further include determining that a write command has not been executed to the address, where writing at the address the code word with the at least one error corrected is based on the determination.

Figure 7:
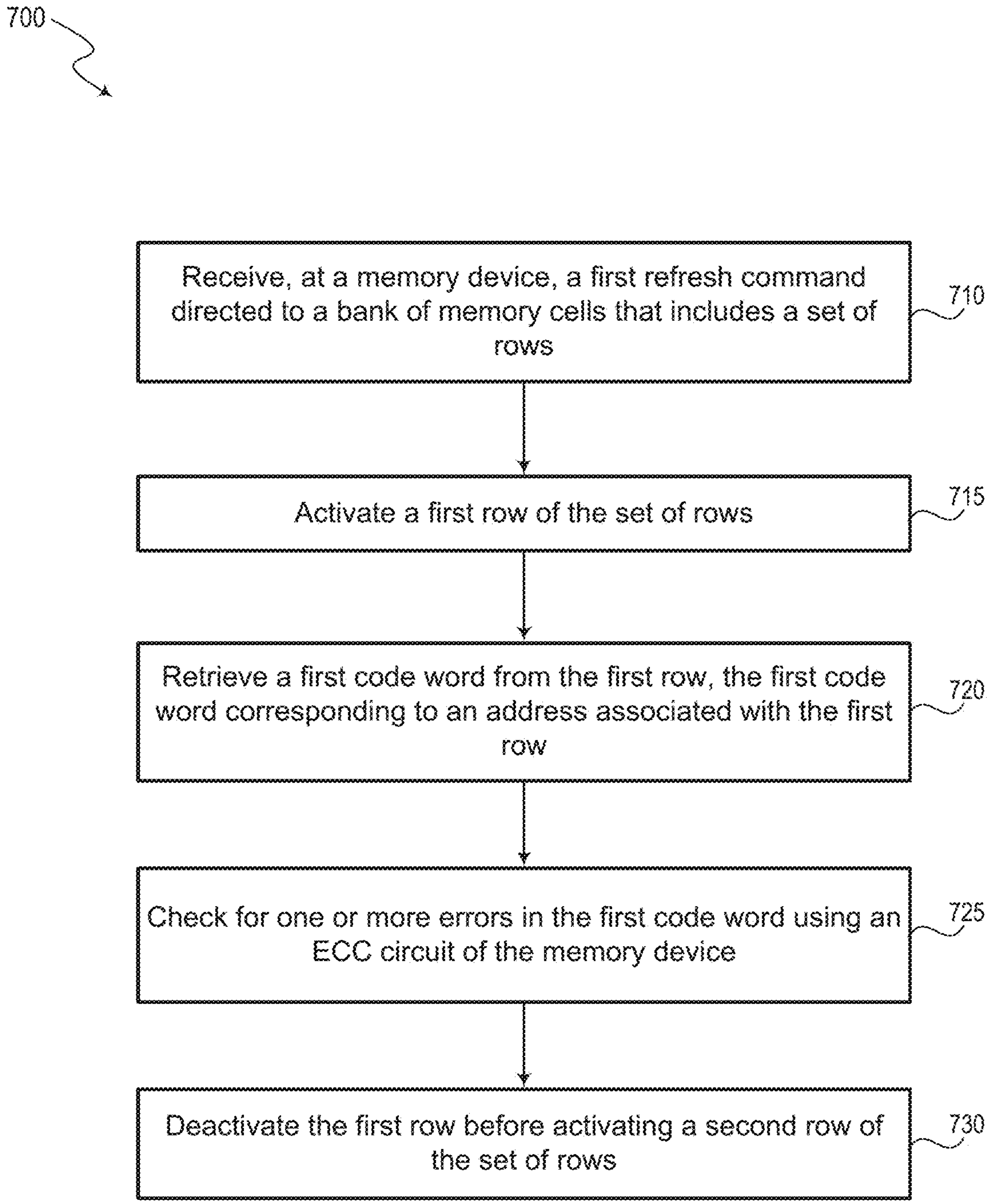

FIG. 7 is a flowchart 700 illustrating a method of operating a memory device in accordance with an embodiment of the present technology. The flowchart 700 may be an example of or include aspects of a method that the memory device 100 (or the ECS circuit 275) may perform as described with reference to FIGS. 1 through 5.

The method includes receiving, at the memory device, a first refresh command directed to a bank of memory cells that includes a set of rows (box 710). In accordance with one aspect of the present technology, the receiving feature of box 710 can be performed by an ECS circuit (e.g., the ECS circuit 175 or 275) and/or the command/address input circuit 105 as described with reference to FIGS. 1 through 5.

The method further includes, in response to receiving the first refresh command, activating a first row of the set of rows (box 715), retrieving a first code word from the first row, where the code word corresponds to an address associated with the first row (box 720), checking for one or more errors in the first code word using an ECC circuit of the memory device (box 725), and deactivating the first row before activating a second row of the set of rows (box 730). In accordance with one aspect of the present technology, the activating feature of box 715 and the retrieving feature of box 720 can be performed by an ECS circuit (e.g., the ECS circuit 175 or 275) and/or the row decoder 140 and the column decoder 145 as described with reference to FIGS. 1 through 5. In accordance with one aspect of the present technology, the checking feature of box 725 can be performed by an ECS circuit (e.g., the ECS circuit 175 or 275) and/or the ECC circuit 220 as described with reference to FIGS. 1 through 5. In accordance with one aspect of the present technology, the deactivating feature of box 730 can be performed by an ECS circuit (e.g., the ECS circuit 175 or 275) and/or the row decoder 140 as described with reference to FIGS. 1 through 5.

In some embodiments, the method may further include correcting at least one error in the first code word. In some embodiments, the method may further include storing the first code word with the at least one error corrected in one or more registers coupled with the bank of memory cells. In some embodiments, the method may further include receiving, at the memory device, a second refresh command directed to the bank of memory cells. In some embodiments, the method may further include, in response to receiving the second refresh command, determining that the first code word includes no error, activating the second row, retrieving a second code word from the second row, and checking for one or more errors in the second code word using the ECC circuit.

In some embodiments, the method may further include correcting at least one error in the first code word using the ECC circuit when the ECC circuit detects the at least one error based on checking for the one or more errors in the first code word. In some embodiments, the method may further include setting an indication that the first code word has been corrected. In some embodiments, the method may further include receiving, at the memory device, a second refresh command directed to the bank of memory cells. In some embodiments, the method may further include, in response to receiving the second refresh command, activating the first row, and writing at the address, based on the indication, the first code word with the at least one error corrected.

In some embodiments, the method may further include determining that a write command has not been executed at the address, where writing at the address the first code word with the at least one error corrected is based on the determination. In some embodiments, the method may further include receiving, at the memory device, a second refresh command directed to the bank of memory cells. In some embodiments, the method may further include, in response to receiving the second refresh command, determining that at least one write command has been executed at the address, activating the second row, retrieving a second code word from the second row, and checking for one or more errors in the second code word using the ECC circuit.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Those skilled in the art will appreciate that the components and blocks illustrated in FIGS. 1-6 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase “selecting a fast connection” can be understood to mean selecting a connection that has a value assigned corresponding to its connection speed that is above a threshold.

As used herein, the word “or” refers to any possible permutation of a set of items. For example, the phrase “A, B, or C” refers to at least one of A, B, C, or any combination thereof, such as any of: A; B; C; A and B; A and C; B and C; A, B, and C; or multiple of any item such as A and A; B, B, and C; A, A, B, C, and C; etc.

Any patents, patent applications, and other references noted above are incorporated herein by reference. Aspects can be modified, if necessary, to employ the systems, functions, and concepts of the various references described above to provide yet further implementations. If statements or subject matter in a document incorporated by reference conflicts with statements or subject matter of this application, then this application shall control.

What is claimed is:

1. A memory device, comprising:

a memory array;

an error correction code (ECC) circuit coupled with the memory array; and circuitry coupled with the memory array and the ECC circuit, the circuitry configured to:

receive a refresh command associated with performing an error check and scrub (ECS) operation associated with one or more rows of memory cells, wherein performing the ECS operation is based at least in part on reception of the refresh command, wherein the reception of the refresh command is in accordance with a refresh interval time (tREFI);

read a code word from a row of the one or more rows based at least in part on the command, the code word corresponding to one or more addresses associated with the row;

detect one or more errors in the code word based at least in part on reading the code word from the row; and correct the one or more errors in the code word based at least in part on detection of the one or more errors.

2. The memory device of claim 1, wherein reading the code word and detecting the one or more errors comprise a first portion of a plurality of portions of the ECS operation.

3. The memory device of claim 1, wherein the circuitry is further configured to:

write data including the code word with the one or more corrected errors based at least in part on correcting the one or more errors.

4. The memory device of claim 3, wherein the circuitry is further configured to:

perform a second portion of the ECS operation, the second portion of the ECS operation comprising writing the data including the code word with the one or more corrected errors.

5. The memory device of claim 1, wherein the circuitry is configured to perform the ECS operation in an automatic ECS mode.

6. The memory device of claim 1, wherein the circuitry is further configured to:

store an indication of a mode associated with the ECS operation at a register of the memory device.

7. The memory device of claim 1, wherein the circuitry is further configured to:

execute an activate command on the row as part of a refresh operation, wherein the ECS operation is based at least in part on executing the activate command.

8. A method, comprising:

receiving a refresh command associated with performing an error check and scrub (ECS) operation associated with one or more rows of memory cells, wherein performing the ECS operation is based at least in part on reception of the refresh command wherein the of the refresh command is in accordance with a refresh interval time (tREFI);

reading a code word from a row of the one or more rows based at least in part on the command, the code word corresponding to one or more addresses associated with the row;

detecting one or more errors in the code word based at least in part on reading the code word from the row; and correcting the one or more errors in the code word based at least in part on detection of the one or more errors.

9. The method of claim 8, wherein reading the code word and detecting the one or more errors comprise a first portion of a plurality of portions of the ECS operation.

10. The method of claim 8, further comprising:

writing data including the code word with the one or more corrected errors based at least in part on correcting the one or more errors.

11. The method of claim 10, further comprising:

performing a second portion of the ECS operation, the second portion of the ECS operation comprising writing the data including the code word with the one or more corrected errors.

12. The method of claim 8, further comprising:

performing the ECS operation in an automatic ECS mode.

13. The method of claim 8, further comprising:

storing an indication of a mode associated with the ECS operation at a register of the method.

14. The method of claim 8, further comprising:

executing an activate command on the row as part of a refresh operation, wherein the ECS operation is based at least in part on executing the activate command.

15. A non-transitory computer-readable medium storing instructions which, when executed by one or more processors of a memory system, cause the memory system to:

receive a refresh command associated with performing an error check and scrub (ECS) operation associated with one or more rows of memory cells, wherein performing the ECS operation is based at least in part on reception of the refresh command wherein the reception of the refresh command is in accordance with a refresh interval time (tREFI);

read a code word from a row of the one or more rows based at least in part on the command, the code word corresponding to one or more addresses associated with the row;

detect one or more errors in the code word based at least in part on reading the code word from the row; and correct the one or more errors in the code word based at least in part on detection of the one or more errors.

* * * * *